United States Patent [19]

Turnbull

[11] Patent Number: 4,704,534
[45] Date of Patent: Nov. 3, 1987

[54] THERMAL RADIATION DETECTOR

[75] Inventor: Andrew A. Turnbull, Reigate, England

[73] Assignee: U.S. Philips Corporation, New York, N.Y.

[21] Appl. No.: 835,709

[22] Filed: Mar. 3, 1986

[30] Foreign Application Priority Data

Mar. 29, 1985 [GB] United Kingdom ................. 8508204

[51] Int. Cl.$^4$ ............................................. G01J 5/10
[52] U.S. Cl. ................................... 250/338; 250/349
[58] Field of Search .................. 250/338 PY, 342, 349

[56] References Cited

U.S. PATENT DOCUMENTS

| 4,379,971 | 4/1983 | Smith et al. | 250/342 |
| 4,425,502 | 1/1984 | Hall et al. | 250/349 |
| 4,469,943 | 9/1984 | Turnbull | 250/338 PY |
| 4,595,832 | 6/1986 | LaDelfe et al. | 250/338 PY |

FOREIGN PATENT DOCUMENTS 3528  1/1985  Japan ............................ 250/338 PY

OTHER PUBLICATIONS

Annis, A. D., et al., "Absorption of Radiation in PLZT Pyroelectric Detectors.", *Infrared Physics*, vol. 14, pp. 199–205 (1974).
Hilsum, C. "Infrared Absorption of Thin Metal Films.", *Journal of the Optical Society of America*, vol. 44, No. 3, pp. 188–191 (Mar. 1954).
Hadley, L. N., et al. "Reflection and Transmission Interference Filters.", *Journal of the Optical Society of America*, vol. 37, No. 6, pp. 451–465 (Jun. 1947).
LaDelfe, P. C., et al., "The Application of Thin Film Absorber Coatings to Enhance the Sensitivity of Fast Pyroelectric Detectors.", *SPIE*, vol. 380, pp. 266–274 (1983).
Silberg, P. A. "Infrared Absorption of Three-Layer Films.", *Journal of the Optical Society of America*, vol. 47, No. 7, pp. 575–578 (Jul. 1957).

*Primary Examiner*—Carolyn E. Fields
*Attorney, Agent, or Firm*—Marc D. Schechter

[57] ABSTRACT

A thermal radiation detector comprises detecting means supported by a flexible film.

To improve the absorption of incident radiation by the thermal radiation detector, the detector comprises an electrically resistive layer which is immediately adjacent the flexible film, and to which the detecting means are thermally coupled. The optical thickness of transparent dielectric material preceding the detecting means (suitably consisting only of the flexible film) is one fourth of a selected wavelength in a given wavelength range to be detected. The wavelength is selected so that the absorption of incident radiation by the resistive layer is substantially a maximum at the selected wavelength. The resistive layer may be between the flexible film and the detecting means, or it may precede the flexible film. In the latter case, an electrically conductive, reflecting layer is disposed between the flexible film and the detecting means.

13 Claims, 6 Drawing Figures

THERMAL RADIATION DETECTOR

BACKGROUND OF THE INVENTION

The invention relates to a thermal radiation detector comprising means, having a temperature-dependent characteristic, for detecting thermal energy. The detecting means are supported by at least one flexible film which is substantially transparent to the radiation to be detected. With respect to the direction of incidence of the thermal radiation to be detected, the flexible film precedes the detecting means. The invention further relates to an array of such detectors, and to a method of operating a thermal radiation detector.

A detector as described above, wherein the detecting means comprises an element of pyroelectric material, is described in European Patent Application EP No. 41,297 (corresponding to U.S. Pat. No. 4,425,502). In one form of infrared detector described therein, the element of pyroelectric material is supported by and between two flexible plastic films which transmit approximately 80% of incident radiation in the wavelength range of 8-14 $\mu$m. The detector receives infrared radiation via one of the plastic films. The plastic films support electrically conductive layers providing electrical connections to the pyroelectric element. This arrangement enables the detector to have particularly low susceptibility to microphony as well as low lateral thermal conductance.

A problem with thermal radiation detectors is absorbing sufficient incident radiation. For example, pyroelectric materials suitable for good-quality detectors typically have rather low absorption over at least part of the wavelength range for which it is desirable to provide such detectors. Furthermore, the thinner the detector (a feature which is desirable to reduce thermal capacitance as well as thermal conductance to the surroundings), the lower will be the overall absorption of the incident radiation by the pyroelectric material.

A conventional way of improving absorption has been to blackened the detector. However, appropriate materials have the disadvantages of being awkward to apply and have poor adhesion.

The paper entitled "The application of thin film absorber coatings to enhance the sensitivity of fast pyroelectric detectors" by Peter C. LaDelfe et al (*SPIE*, Vol. 380 (1983), pages 266-273) refers to the application to a pyroelectric detector of a three-layer coating consisting of a dielectric layer sandwiched between two metal layers. Such coatings are described by Hilsum (in "Infrared Absorption of Thin Metal Films," *Journal of the Optical Society of America*, Volume 44, No. 3 (1954), pages 188-191) and Silberg (in "Infrared Absorption of Three-Layer Films," *Journal of the Optical Society of America*, Volume 47, No. 7 (1957), pages 575-578). See, also "Reflection and Transmission Interference Filters" by L. N. Hadley and D. M. Dennison (*Journal of the Optical Society of America*, Volume 37, No. 6 (1947), pages 451-465.

The paper by LaDelfe et al refers to the work of Annis and Simpson ("Absorption of Radiation in PLZT Pyroelectric Detectors", *Infrared Physics*, Volume 14 (1974), pages 199-205). Annis and Simpson applied the theoretical work of Hadley & Dennison, Hilsum and Silberg to a three-layer structure wherein the dielectric sandwiched between the two metal layers was the pyroelectric material itself and had a thickness of 10-15 $\mu$m, giving an optical thickness of roughly 2½ wavelengths in a typical operating range. LaDelfe et al themselves applied a two-layer coating consisting of a metal layer and an antireflection layer to chips of pyroelectric material 0.25 mm thick.

SUMMARY OF THE INVENTION

According to the first aspect of the invention, a thermal radiation detector comprises means for detecting thermal energy. The detecting means are supported by at least one flexible film which is substantially transparent in the wavelength range to be detected. With respect to the direction of incidence of thermal radiation to be detected, the flexible film precedes the detecting means.

The detector according to the invention further comprises an electrically resistive layer which also precedes the detecting means. The resistive layer is disposed immediately adjacent the flexible film, an in use has a substantial net effective resistance per square such that the layer absorbs a substantial proportion of incident radiation in the wavelength range to be detected. The detecting means are thermally coupled to the resistive layer. The optical thickness of the dielectric material is substantially one quarter of the wavelength at which it is desired that the absorption of incident radiation by the resistive layer should be substantially a maximum.

Suitably, the optical thickness of the flexible film is substantially one quarter of the selected wavelength. This avoids difficulties such as "crazing" which would be liable to arise if a layer of suitable dielectric material, which typically is brittle, were to be deposited on a flexible film to make up a total optical thickness of a quarter of the selected wavelength.

The invention involves the recognition that a flexible film which is used to support the detecting means and which can provide the mechanical advantage of low microphony and the thermal advantage of low thermal conductance can also be used as part of or, preferably, the entire thickness of a quarter-wavelength optical layer in combination with an electrically resistive layer for improving the absorption of incident thermal radiation.

If the electrically resistive layer is electrically in parallel with one or more adjacent further layers having some electrical conductivity, then either the resistance per square of the further layer(s) should be sufficiently high to not substantially reduce the effective resistance per square of the first-mentioned electrically resistive layer, or the resistance per square of the electrically resistive layer should be selected so that in combination with the further layer(s), its net effective resistance per square has a suitable value for substantially absorbing radiation in the desired operating wavelength range.

A detector embodying the invention can be relatively easy to make, and the means used to improve the absorption of radiation need add only relatively little thermal capacitance to the detector.

The selected wavelength may be such as substantially to maximize the absorption of incident radiation by the detector over the wavelength range to be detected.

In one form of the detector embodying the invention, the resistive layer may be disposed between the flexible film and the detecting means. The resistance per square of the resistive layer to be adapted in dependence on the refractive index of the flexible film to substantially optimize the absorption of incident radiation by the resistive layer in the region of the selected wavelength. A suitable theoretical value is substantially $377/(1+n^2)$ ohms per square where n is the refractive index of the flexible film.

It may be noted that UK Patent Application GB No. 2,100,058 (corresponding to U.S. Pat. No. 4,469,943) discloses a thermal radiation detector comprising an element of pyroelectric material supported by and between two flexible films. A layer for absorbing incident radiation is disposed between one of the flexible films and the pyroelectric element. The absorbing layer may be of antimony, 50 nm thick.

In that detector, however, the absorbing layer is contiguous with a coextensive electrically conductive further layer which may be of aluminum about 0.5 μm thick. The latter layer has a very low resistance per square, so that the net effective resistance per square of the absorbing layer is at least as low. Consequently, the absorption of incident radiation by the absorbing layer will depend on processes not concerned with the electrical conductance of the layer.

In another form of detector embodying the invention, the detector may comprise a substantially reflecting electrically conductive layer disposed between the flexible film and the detecting means. The resistive layer is on the side of the flexible film remote from the detecting means. The reflecting layer and the resistive layer are substantially coextensive. If, with respect to the direction of incidence of thermal radiation to be detected, the resistive layer is immediately preceded by free space, the resistive layer suitably has a resistance per square substantially equal to the characteristic impedance of free space.

Suitably, the total thermal capacitance of the layer or layers and of the portion of the flexible film coextensive therewith is much less than the thermal capacitance of the detecting means.

According to a further aspect of the invention, when the detecting means and the resistive layer are adjacent, the resistive layer extends over substantially the entire surface of the detecting means and substantially beyond at least part of the periphery thereof. The resistive layer may supply to the detecting means thermal energy from radiation incident on every part of the resistive layer.

The above-mentioned UK Patent Application GB No. 2,100,058 discloses a thermal radiation detector wherein thermal energy is supplied to detecting means (in this case a pyroelectric element) from radiation incident on an operative surface region of the detector substantially larger than an adjacent face of the pyroelectric element. This aspect of the present invention involves the recognition that the layer disposed between the detecting means and the flexible film in an embodiment of the present invention can extend substantially beyond at least part of the periphery of the adjacent face of the detecting means, and can be used to supply to the detecting means at that face thermal energy from radiation incident on an operative surface region larger than that face.

Where the layer disposed between the detecting means and the flexible film is a resistive layer, the extent of that layer generally constitutes the operative surface region of the detector. Thermal energy from radiation incident on a portion of the layer not overlying the detecting means may be supplied laterally to the detecting means along the flexible film as well as along the layer itself.

Where the layer disposed between the detecting means and the flexible film is an electrically conductive layer, the operative surface region of the detector is generally constituted by the extent of the resistive layer on the opposite side of the flexible film. Thermal energy from radiation incident on the resistive layer in this case has to travel through the flexible film. In the case of radiation incident on a portion of the resistive layer not overlying the detecting means, thermal energy can travel laterally toward the detecting means more readily along the electrically conductive layer than along the resistive layer.

A detecting array may comprise a plurality of substantially similar, substantially uniformly spaced detectors. One flexible film is common to all the detectors. The gaps between the respective layers, disposed between the detecting means and the flexible film, of adjacent detectors are substantially smaller than the gaps between the respective detector means thereof.

Suitably, in a detector embodying the invention, the detecting means comprise an element of pyroelectric material.

According to another aspect of the invention, in a method of operating a thermal radiation detector, the detector comprising means having a temperature-dependent characteristic for detecting thermal energy, wherein the detecting means are supported by at least one flexible film which is substantially transparent at wavelengths to be detected. With respect to the direction of incidence of thermal radiation to be detected, the flexible film precedes the detecting means.

The detector further comprises an electrically resistive layer which also precedes the detecting means. The resistive layer is disposed immediately adjacent the flexible film. In use, the resistive layer has a substantial net effective resistance per square such that the layer absorbs a substantial proportion of incident radiation in the wavelength range. The detecting means are thermally well coupled to the resistive layer.

The method comprises detecting thermal radiation in a wavelength range in which the optical thickness of the substantially transparent dielectric material (the flexible film) is substantially one quarter of a wavelength, in the wavelength range, at which the absorption of incident radiation by the resistive layer is substantially a maximum. The wavelength of maximum absorption by the resistive layer may be such as substantially to maximize the absorption of incident radiation by the detector over the wavelength range.

DESCRIPTION OF THE PREFERRED EMBODIMENTS

Figure 1:
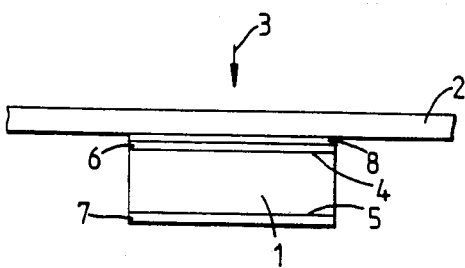
FIG. 1 is a cross-section of the first embodiment of the invention in which a resistive layer is disposed between the detecting means and the supporting flexible film.

Referring to FIG. 1, a detector of thermal radiation comprises an element 1 of pyroelectric material supported by at least one flexible film 2. Radiation to be detected is incident in the direction of the arrow 3. The flexible film 2 (which thus precedes the pyroelectric element 1) transmits a substantial majority of incident radiation in the operating wavelength range of the detector.

When the temperature of the pyroelectric element 1 changes owing to the absorption of thermal energy from incident radiation, charges are developed at opposed faces of the element, in this case the upper and lower major surfaces (as drawn) 4 and 5, respectively. The charges may be detected via electrical connections (not shown) made to those faces. The surfaces 4 and 5 are in this embodiment provided with respective electrode layers 6 and 7.

Since charges are developed at the faces 4 and 5 only while the temperature of the element 1 changes, the radiation incident on the detector may vary with time in order that it may be detected. This may inherently be the case where it is desired that the detector should respond to changes in an otherwise substantially unchanging environment, as for example in an intruder detector. It may alternatively be achieved by scanning the detector across a scene being viewed or by chopping the incident radiation.

Since the pyroelectric element 1 (especially if it is very thin) as well as the flexible film 2 may generally absorb relatively little of the incident radiation over at least part of the operating wavelength range, it is desirable to increase the absorption of radiation in order to increase the sensitivity of the detector. This may be done by choosing the thickness of the flexible film 2 so as to reduce the reflection of incident radiation and by providing between the pyroelectric element 1 and the flexible film 2 an electrically resistive layer 8 with a suitable resistance per square to substantially absorb radiation.

Reflection is a minimum at wavelengths for which the optical thickness of the film 2 (i.e. the product of the physical thickness of film 2 and its refractive index n) is an odd number of quarter wavelengths. Reflection is a maximum at wavelengths for which the optical thickness is an even number of quarter wavelengths.

The greatest bandwidth over which reflection is reduced is obtained by making the optical thickness substantially one quarter of a selected wavelength chosen:

(i) bearing in mind that reflection increases fairly rapidly to a maximum as the wavelength of the incident radiation decreases from the selected value to half the selected value but increases much less rapidly as the wavelength increases from the selected value, and (ii) taking into account the spectral absorption characteristic of the pyroelectric material (some of the radiation which may not be absorbed by the resistive layer but is transmitted by it can then be absorbed by the pyroelectric material). In view of the (i) above, the selected wavelength may, for example, be slightly below the lower limit of the wavelength range over which it is intended to operate the detector. Other factors, such as the spectral characteristic of a window behind which the detector is mounted, may also be taken into account.

Since radiation is absorbed by the resistive layer, it is of course necessary that the pyroelectric element should be thermally coupled to it in order for the temperature of the element to be changed by the thermal energy of the absorbed radiation.

A theoretical analysis shows that the absorption A of radiation at the selected wavelength by a resistive layer preceded by dielectric material with an optical thickness of a quarter of that wavelength is given by the expression $$A = 4\,c\,n^2/(c+1+n^2)^2$$

where n is the refractive index of the dielectric material and $c = 377/R$ where R is the resistance per square of the resistive layer. Improved absorption should therefore be obtained if the resistance per square of the resistive layer is adapted in dependence on the refractive index of the dielectric material, and in particular should be a maximum if $$R_{opt} = 377/(1+n^2).$$

In that case, the expression for the absorption simplifies to $$A_{max} = n^2/(1+n^2).$$

If $n = 1.8$, the value of $R_{opt}$ is about 90 ohms per square and the value of $A_{max}$ is about 76%.

The above theoretical analysis strictly applies only if the resistive layer is immediately succeeded by free space. Where the resistive layer is followed by further material comprising for example a pyroelectric element, the actual value of A will vary with wavelength between alternate local maxima and minima (whose spacing in wavelength will for example depend on the thickness of the pyroelectric element). The maxima lie on the theoretical curve for A.

The pyroelectric element 1 may be mounted in the manner described in the above mentioned European Patent Application EP No. 41,297, suitably using a second flexible film (not shown) adjacent the lower face 5 of the pyroelectric element so that the element is sandwiched between the films. The pyroelectric material may be, for example, PLMZT. The element 1 may have, for example, major surfaces which are square with a side of 0.5 mm, and may have a thickness of 20 μm, obtained by polishing down a thicker slice of the material.

The flexible film(s) may be of polyimide material. In the case of a detector for which it is desired to maximize absorption of radiation by the resistive layer at a wavelength of 8 μm, and taking a value for n of 1.8, the thickness of the flexible film 2 should be 1.1 μm.

The electrode layers 6 and 7, which suitably are provided if the pyroelectric material is a ceramic to ensure good electrical contact to the surfaces of the pyroelectric element, may be of sputtered nickel/chromium alloy. The resistive layer 8 may also be of a nickel/chromium alloy, provided by evaporation or sputtering on the flexible film 2 before the pyroelectric element with its deposited electrodes is brought up to the film. Good electrical and thermal contact between the electrode 6 and the resistive layer 8 can be obtained by wetting the surfaces with an organic solvent which will then evaporate by permeation through the film 2.

The above analysis has neglected the effect on the resistance per square of the electrically resistive layer 8 of the contiguous coextensive electrode layer 6. Preferably, either the resistance per square of the electrode layer 6 should be sufficiently high not to substantially reduce the net effective resistance per square of the electrically resistive layer 8 (which may be quite acceptable for high-impedance detecting means such as a pyroelectric element), or the resistance per square of the layer 8 per se should be such that in parallel with the layer 6, its net effective resistance per square has a suitable value for substantially absorbing radiation.

Figure 2:
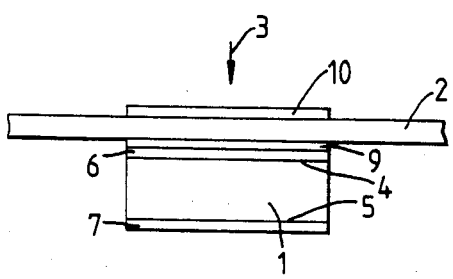
FIG. 2 is a cross-section of a second embodiment in which a conductive layer is disposed between the detecting means and the supporting flexible film, and a resistive layer is disposed on the other side of the flexible film.

FIG. 2 is a cross-section of a second embodiment of the invention wherein the same reference numerals are used as in FIG. 1 for corresponding elements. In this embodiment, an electrically conductive, substantially reflecting layer 9 is disposed between the pyroelectric element 1 and the flexible film 2. An electrically resistive layer 10 coextensive with the layer 9 is disposed on the other side of the film 2. As a result, incident thermal radiation which is transmitted rather than being absorbed by the resistive layer 10 can be reflected back by the layer 9 for further absorption by the layer 10.

The optical thickness of the film 2 is again one quarter of the selected wavelength. Where, as in this particular embodiment, the resistive layer 10 is immediately preceded by free space, the resistance per square of the resistive layer is suitably equal to the characteristic impedance of free space (i.e. substantially 377 ohms). It is considered that for the reflecting layer 9, a resistance per square on the order of 1 ohm should be adequately low.

This embodiment can be made in a similar manner to that of FIG. 1. The reflecting layer 9 suitably comprises a nickel/chromium "seed" layer coated with a gold layer (both formed by vacuum-deposition).

In the embodiment of FIG. 1, an electrical connection to the upper electrode layer 6 may be made by forming the electrically resistive layer 8 with an extension to provide such a connection. The dimensions of this extension may be selected as a compromise between minimizing thermal conductance (to reduce the loss of thermal energy from the detector) and minimizing Johnson noise due to the connection. An electrical resistance for the connection (for example to an amplifier) roughly on the order of 1 kilohm may be suitable.

In the embodiment of FIG. 2, a similar connection may be provided by a further electrically resistive layer on the flexible film 2 (on the lower surface thereof as drawn) overlapping an edge portion of the electrically conductive layer 9. In each embodiment, an electrical connection to the lower electrode layer 5 may for example be provided in the manner described in the above-mentioned European Patent Application EP No. 41,297.

Compared with the embodiment of FIG. 1, the embodiment of FIG. 2 has the disadvantage that the thermal energy of radiation absorbed in the resistive layer 10 has to be conducted through the flexible film 2 to reach the detecting means (the pyroelectric element 1). On the other hand, the FIG. 2 embodiment has the advantage that it can achieve higher absorption of the incident radiation. Although the plastic material typically used for the flexible film has low thermal conductivity, the thickness of the film is generally so small (typically about 1 μm) that the thermal conductance is fairly high, and overall it is considered that the advantage will usually outweigh the disadvantage.

In the embodiments of FIGS. 1 and 2, the area of the resistive layer is substantially equal to the area of the upper major surface 4 of the pyroelectric element. It may be desirable for thermal energy to be collected from radiation incident on a larger area.

Figure 3:
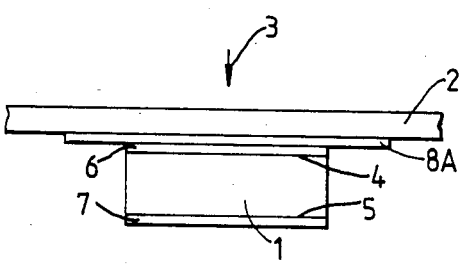
FIGS. 3 and 4 show further embodiments corresponding to those of FIGS. 1 and 2, respectively, wherein the layer disposed between the detecting means and the flexible film extends beyond the periphery of the adjacent face of the detecting means.
Figure 4:
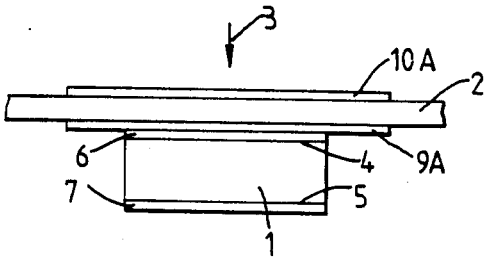

FIGS. 3 and 4 show two further embodiments corresponding, respectively, to those of FIGS. 1 and 2 in which this is the case. The resistive layer 8A in the embodiment of FIG. 3 and the conducting layer 9A and the coextensive resistive layer 10A in FIG. 4 extend over the entire surface 4 of the pyroelectric element and substantially beyond the periphery thereof, in this case at least on two opposite sides of the periphery (i.e. to the left and to the right as drawn).

The pyroelectric element may be situated substantially centrally with respect to the layer(s), but this is by no means critical. It is however important that thermal energy from radiation incident on a part of the detector remote from the detecting means should be supplied to the detecting means by thermal conduction over a distance which is substantially less than the thermal diffusion distance (which depends on the maximum frequency of operation of the detector), as discussed in the above-mentioned UK Patent Application GB No. 2,100,058.

The layer(s) need not be the same shape as the adjacent surface of the pyroelectric element. For example, where the latter is square (as mentioned above), the layers may be rectangular or circular.

The embodiments of FIGS. 3 and 4 may be made in a similar manner to those of FIGS. 1 and 2. In the embodiment of FIG. 3, since the electrically resistive layer 8A extends beyond the electrode layer 6, it may be desirable for the electrode layer 6 to have a relatively high resistance per square so that the net effective resistance per square of the electrically resistive layer 8A does not vary greatly across the layer 8A.

Figure 5:
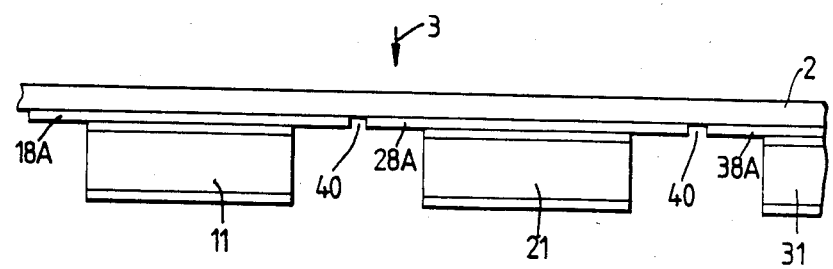
FIG. 5 is a cross-section of part of a detector array according to the invention.
Figure 6:
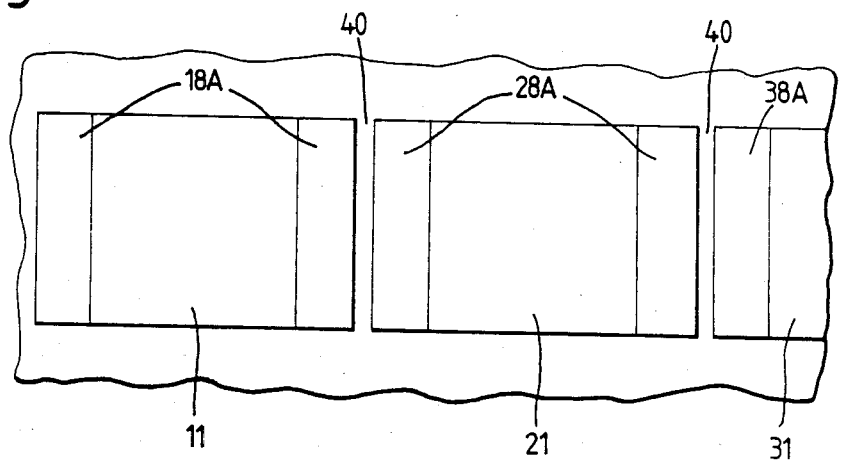
FIG. 6 is a plan view of the part of the array shown in FIG. 5.

An embodiment of the invention in which the layer disposed between the detecting means and the flexible film extends substantially beyond the periphery of an adjacent surface of the detecting means may be particularly suitable for forming an array of detectors, especially where it is desired that the gap between two adjacent detectors should be small. FIGS. 5 and 6 are, respectively, a cross-section and a plan view from the underside of part of a linear array of detectors, each of the form shown in FIG. 3. The three detectors shown comprise respective pyroelectric elements 11, 21 and 31 are respective resistive layers 18A, 28A and 38A, and are supported on a common flexible film 2. Adjacent resistive layers are separated by a respective narrow gap 40. The gaps may be produced by evaporation of the resistive metal through a mask, or by photolithography and etching of a continuous resistive coating for the complete array.

The pyroelectric elements may each be squares of 0.5 mm side, and the resistive layers may measurement 0.5 mm × 0.6 mm (i.e. an average overlap of 50 μm on each of two opposite sides of the associated pyroelectric element). The gap between adjacent resistive layers may be 20 μm wide.

Thermal detecting means other than a pyroelectric element may be used in an embodiment of the invention. For example the detecting means may be a dielectric element whose capacitance changes with temperature. Changes in capacitance are measured to detect incident radiation.

Although in the embodiments of the invention described with reference to the drawings the flexible film 2 constitutes all the substantially transparent dielectric material preceding the detecting means, such material (whose total optical thickness is a quarter of the selected wavelength) might comprise other dielectric material as well. The thickness of the flexible film is then reduced accordingly.

For example, a layer of other dielectric material could be vacuum-deposited on the flexible film on the side thereof remote from that on which the thermal detecting means are disposed. If this other dielectric material had a refractive index higher than that of the flexible film material, this would mean that the total physical thickness of the dielectric material would be reduced. This might be advantageous in embodiments wherein the resistive layer is on the side of the flexible film remote from the detecting means, in that the path length for the transmission of thermal energy from the resistive layer to the detecting means would be reduced (the thermal conductivity of the other dielectric material must of course also be taken into account). However, the deposition of a thin layer of relatively brittle dielectric material on a flexible film is liable to result in the thin layer breaking up or "crazing".

I claim:

1. A thermal radiation detector for detecting radiation in a selected wavelength range, said detector comprising:
   a flexible film which is substantially transparent to radiation in the selected wavelength range, said film having an optical thickness equal to one-quarter of a wavelength in the selected wavelength range;
   detection means for detecting thermal energy, said detection means being mounted on the flexible film; and
   an electrically resistive layer arranged adjacent to the flexible film, said resistive layer having a net effective resistance per square such that the resistive layer absorbs a substantial portion of incident radiation in the selected wavelength range, said resistive layer being highly thermally coupled to the detection means.

2. A detector as claimed in claim 1, characterized in that the resistive layer is arranged between the flexible film and the detection means.

3. A detector as claimed in claim 2, characterized in that:
   the flexible film has a refractive index of in; and
   the resistive layer has a resistance per square substantially equal to $377/(1+n^2)$ ohms per square.

4. A detector as claimed in claim 3, characterized in that the detector further comprises a substantially reflecting, electrically conductive layer arranged between the resistive layer and the detection means.

5. A detector as claimed in claim 1, characterized in that the flexible film is arranged between the resistive layer and the detection means.

6. A detector as claimed in claim 1, characterized in that:
   the detection means has a thermal capacitance; and
   the resistive layer and the flexible film have a combined thermal capacitance which is much less than the thermal capacitance of the detection means.

7. A detector as claimed in claim 1, characterized in that the resistive layer extends beyond the periphery of the detection means.

8. A detector as claimed in claim 1, characterized in that the detection means is a pyroelectric element.

9. A detector as claimed in claim 1, characterized in that the flexible film has an optical thickness equal to one-quarter of a wavelength chosen to maximize absorption of radiation by the detector in the selected wavelength range.

10. A method of detecting thermal radiation in a selected wavelength range, said method comprising the steps of:
    passing the thermal radiation to be detected through a flexible film which is substantially transparent to radiation in the selected wavelength range, said film having an optical thickness equal to one-quarter of a wavelength in the selected wavelength range so that the film absorbs thermal radiation;
    conducting thermal energy from the flexible film to detection means for detecting thermal energy;
    passing the thermal radiation to be detected through an electrically resistive layer, said resistive layer having a net effective resistance per square such that the resistive layer absorbs a substantial portion of incident radiation in the selected wavelength range; and
    conducting thermal energy from the resistive layer to the detection means.

11. A method as claimed in claim 10, characterized in that the resistive layer has a wavelength of maximum absorption chosen to substantially maximize the absorption of incident radiation by the detection means in the selected wavelength range.

12. A thermal radiation detector for detecting radiation in a selected wavelength range of 8-14 microns, said detector comprising:
    a flexible film which is substantially transparent to radiation in the selected wavelength range, said film having an optical thickness equal to one-quarter of a wavelength in the selected wavelength range, said film having a refractive index of n;
    detection means for detecting thermal energy in the wavelength range of 8-14 microns, said detection means being mounted on the flexible film; and
    an electrically resistive layer arranged adjacent to the flexible film, said resistive layer having a net effective resistance per square substantially equal to $377/(1+n^2)$ ohms per square, said resistive layer being highly thermally coupled to the detection means.

13. A method of detecting thermal radiation in a selected wavelength range of 8-14 microns, said method comprising the steps of:
    passing the thermal radiation to be detected through a flexible film which is substantially transparent to radiation in the selectd wavelength range, said film having an optical thickness equal to one-quarter of a wavelength in the selected wavelength range so that the film absorbs thermal radiation, said flexible film having a refractive index of n;
    conducting thermal energy from the flexible film to detection means for detecting thermal energy;
    passing the thermal radiation to be detected through an electrically resistive layer, said resistive layer having a net effective resistance per square substantially equal to $377/(1+n^2)$ ohms per square such that the resistive layer absorbs a substantial portion of incident radiation in the selected wavelength range; and
    conducting thermal energy from the resistive layer to the detection means.

* * * * *

UNITED STATES PATENT AND TRADEMARK OFFICE
CERTIFICATE OF CORRECTION

PATENT NO. : 4,704,534
DATED : November 3, 1987
INVENTOR(S) : Andrew A. Turnbull It is certified that error appears in the above-identified patent and that said Letters Patent is hereby corrected as shown below:

Claim 3, line 3 (column 9, line 50) "in" should read --n--;

Signed and Sealed this

Fifteenth Day of March, 1988

Attest:

*Attesting Officer*

DONALD J. QUIGG

*Commissioner of Patents and Trademarks*